(12) United States Patent
Nakashiba

(10) Patent No.: US 7,218,346 B1
(45) Date of Patent: May 15, 2007

(54) METHOD FOR DRIVING SOLID-STATE IMAGE PICKUP DEVICE

(75) Inventor: Yasutaka Nakashiba, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/317,056

(22) Filed: May 24, 1999

(30) Foreign Application Priority Data

Jun. 3, 1998 (JP) ................... 10-154130

(51) Int. Cl.
  *H04N 9/07* (2006.01)
(52) U.S. Cl. ................... 348/248; 348/249; 348/367
(58) Field of Classification Search ............... 348/299, 348/367, 314, 248, 249; 257/445
  See application file for complete search history.

(56) References Cited

U.S. PATENT DOCUMENTS

| | | | | |
|---|---|---|---|---|
| 4,626,915 A | * | 12/1986 | Takatsu | 348/299 |
| 4,644,572 A | * | 2/1987 | Lambeth | 377/60 |
| 4,696,021 A | * | 9/1987 | Kawahara et al. | 377/58 |
| 4,875,101 A | * | 10/1989 | Endo et al. | 348/314 |
| 4,974,043 A | * | 11/1990 | Stevens | 257/234 |
| 5,341,220 A | * | 8/1994 | Juen | 348/296 |
| 5,382,978 A | * | 1/1995 | Tanaka | 348/312 |
| 5,404,039 A | * | 4/1995 | Watanabe | 257/230 |
| 5,483,282 A | * | 1/1996 | Nakanishi | 348/311 |
| 5,867,055 A | * | 2/1999 | Asaumi et al. | 327/525 |
| 5,903,021 A | * | 5/1999 | Lee et al. | 257/292 |
| 5,978,024 A | * | 11/1999 | Lee | 348/299 |
| 6,043,479 A | * | 3/2000 | Chiang | 250/208.1 |
| RE36,812 E | * | 8/2000 | Tani | 348/298 |
| 6,166,768 A | * | 12/2000 | Fossum et al. | 348/308 |
| 6,326,230 B1 | * | 12/2001 | Pain et al. | 438/57 |
| 6,351,284 B1 | * | 2/2002 | Watanabe et al. | 348/312 |
| 6,515,703 B1 | * | 2/2003 | Suzuki et al. | 348/317 |

(Continued)

FOREIGN PATENT DOCUMENTS

JP  57-99876  6/1982

(Continued)

OTHER PUBLICATIONS

A) Takemura Hiroo "CCD Camerra Technique" Radio Gijutu Co., Showa 61 (1986) Nov. 3, First Edition, pp. 23-30, pp. 46-50 (Mentioned in pp. 1 and 4 of the specification).

(Continued)

*Primary Examiner*—Vivek Srivastava
*Assistant Examiner*—Yogesh Aggarwal
(74) *Attorney, Agent, or Firm*—Katten Muchin Rosenman LLP

(57) ABSTRACT

A method to overcome a disadvantage that the signal charges decrease depending upon the storage time in a photo-electric conversion unit of a solid-state image pickup device. At the moment $t_2$ when a prescribed exposure time ($t_1$–$t_2$) passes, the incident light is cut off by a cut off means such as a mechanical shutter of an interlace solid-state image pickup device. Then, at the time $t_3$, a voltage VBsub is applied to N$^-$ semiconductor substrate 107 to raise up the potential barrier $\Delta\phi$ of the vertical OFD for the signal charges, whereby the leakage of the signal charges due to the self-induced drift, or the thermal diffusion is suppressed. Then, signal charges are read out from the odd lines at the time $t_4$ and signal charges are read out from the even lines at the time $t_5$.

16 Claims, 11 Drawing Sheets

U.S. PATENT DOCUMENTS 6,833,871 B1 * 12/2004 Merrill et al. ............... 348/302
7,095,440 B2 * 8/2006 Fossum ....................... 348/308
2001/0043275 A1 * 11/2001 Hirota et al. ............... 348/312

FOREIGN PATENT DOCUMENTS

| JP | 61-272965 | 12/1986 |
| JP | 62-162356 | 7/1987 |
| JP | 4-73834 | 11/1992 |
| JP | 05-336453 | 12/1993 |
| JP | 07-284024 | 10/1995 |
| JP | 61-99473 | 5/1996 |
| JP | 9-139490 | 5/1997 |
| JP | 10-150183 | 6/1998 |

OTHER PUBLICATIONS

B) Ishihara Yasuo et al. "Interline CCD Image Sensor with Vertical Overflow Drain" Journal of Television Society Vo. 37, No. 10 (1983), pp. 782-787 (mentioned in p. 3 of the specification).

* cited by examiner

SUBSTRATE VPLTAGE Vsub

METHOD FOR DRIVING SOLID-STATE IMAGE PICKUP DEVICE

BACKGROUND OF THE INVENTION

1. Technical Field of the Invention

The present invention relates to a method for driving solid-state image pickup devices.

2. Description of the Prior Art

When a color VTR (video tape recorder) camera for an interlace signal for the standard TV receiver is used for a solid-state image pickup devices such as a electronic still camera, or an image input device for personal computers, a signal processing for converting the pixel number and the scanning format is required, because the progressive format for monitors of personal computers is different from the interlace format.

Therefore, the progressive format solid-state image pickup devices which can read out all the pixels without the conversion processes are employed for the electronic still camera or the input device for the personal computers.

Nevertheless, the interlace format solid-state image pickup devices are used often, because they can be manufactured by fewer steps, their image cells can be highly integrated, and they can be used also as the color VTR camera, as described in TAKEMURA Hiroo "CCD Camera Technique" Radio Gijutu Co., Showa 61 (1986) Nov. 3, First Edition, pp 23–30, pp46–50.

There is shown in FIG. 7 a plan view of a conventional interlace solid-state image pickup device with a vertical charge transfer unit wherein signal charges are transferred by double layered electrodes and four phased pulses.

The conventional interlace solid-state image pickup device as shown in FIG. 7 comprises photo-electric conversion unit 101, vertical charge transfer unit 102, horizontal charge transfer unit 103, and output circuit 104. Concretely, one step vertical charge transfer unit 102 is connected with two horizontal photo-electric conversion units 101, or in other words, 1/2 step vertical charge transfer unit 102 is connected with one horizontal photo-electric conversion units 101.

There is shown in FIG. 8 a plan view of enlarged cells which comprises photoelectric conversion unit 101, vertical charge transfer unit 102, first charge transfer electrode 105, and second charge transfer electrode 106.

There is shown in FIG. 9 a cross sectional view of the cells along the lines I-I' of FIG. 8. The cell as shown in FIG. 9 comprises N⁻ semiconductor substrate 107, P⁻ semiconductor substrate 108, N semiconductor region 109, P⁺ semiconductor 110, first charge transfer electrode 105 of first poly-silicon 111, second charge transfer electrode 106 of second poly-silicon 112, shading film 113 such as aluminum film, insulating film 114, and cover insulating film 115.

The conventional interlace solid-state image pickup device operates under the timing chart as shown in FIG. 10.

Firstly, in order to reset the charges in photo-electric conversion unit 101 at $t_1$, a reverse bias voltage VHsub is applied to N⁻ semiconductor substrate 107 as shown in FIG. 11. Hereupon, the charges in photo-electric conversion unit 101 are swept out into N⁻ semiconductor substrate 107, because N semiconductor region 109 and P⁻semiconductor region 108 become complete depletion layers. Such an structure is generally called a vertical over-flow drain (OFD) structure as described in Journal of Television Society Vol. 37, No.10 (1983) pp782–787.

Next, a voltage VBsub is applied to N⁻ semiconductor substrate 107 to start storing signal charges corresponding to the incident light, while surplus charges which can not be stored in photo-electric conversion unit 101 are excluded into N⁻semiconductor substrate 107 by using vertical OFD. Such an exclusion of the surplus charges is called blooming control.

Next, at the moment $t_2$ when a prescribed exposure time $(t_1-t_2)$ passes, the incident light is cut off by a cut off means such as a mechanical shutter which is positioned in front of the solid-state image pickup device.

Then, at the time $t_4$, signal charges, for example, such as signal charges 11,12,13,31,32,33,51,52,53 in photo-electric conversion unit 101 are read out into vertical charge transfer units 102 which transfer vertically the signal charges line by line into horizontal charge transfer unit 103 which transfers the signal charges horizontally to output them from output circuit 104.

Finally, at the time $t_5$, signal charges, for example, such as signal charges 21,22,23,41,42,43,61,62,63 in photo-electric conversion unit 101 are read out into vertical charge transfer units 102 and then outputted likewise from output circuit 104. Thus, the signal charges from all of the pixels for one frame of display can be acquired, as described in TAKEMURA Hiroo "CCD Camera Technique" Radio Gijutu Co., Showa 61 (1961) Nov. 3, First Edition, pp23–30, pp46–50.

However, the above-mentioned conventional device has a disadvantage that the read out saturation signal decreases with increasing read out cycles wherein the photo-electric conversion unit is read out several times part by part.

SUMMARY OF THE INVENTION

Therefore, an object of the present invention is to provide a method, which improves the above-mentioned disadvantage, for driving solid-state image pickup devices.

The method of the present invention is a method for driving a solid-state image pickup device which stores, in a plurality of photo-electric conversion units, signal charges corresponding to an incident light image during a prescribed time period and excludes surplus charges by an electric potential barrier. Further, the solid-state image pickup device reads out, after cutting off the incident light by a cut-off means such as a mechanical shutter, the signal charges by grouping a plurality of the photo-electric conversion unit into a prescribed number of regions. Furthermore, the device outputs the image signal from all of the photo-electric conversion units by repeating the read-out procedures. In the method of the present invention for driving the above-mentioned device, the signal charges are read out by raising up the above-mentioned electric potential after cutting off the incident light.

The solid-state image pickup device may be provided with a photo-electric conversion unit with a vertical overflow drain (OFD) structure for blooming control which excludes the surplus charges by the electric potential barrier by a voltage applied to the substrate of the vertical OFD structure. In the method of the present invention for driving such a device, the signal charges are read out by raising up the above-mentioned electric potential after cutting off the incident light.

The solid-state image pickup device may also be provided with a photo-electric conversion unit with a horizontal overflow drain (OFD) structure for blooming control which excludes the surplus charges by the electric potential barrier by a voltage applied to the gate of the horizontal OFD structure. In the method of the present invention for driving such a device, the signal charges are read out by raising up the above-mentioned electric potential after cutting off the incident light.

Further, in the method of the present invention, the electric potential during the read-out step may be raised up by a voltage greater than 0.4 V. Further, the electric potential during the read-out step is deeper than an adjacent electric potential which is applied, during the times except the read-out step, to the photo-electric conversion units which are adjacent to those which are being read out. Furthermore, the potential difference between the electric potential during the read-out step and the adjacent electric potential may be greater than 0.4 V.

According to the present invention, the disadvantage that the signal charges decrease depending upon the storage time is overcome by the first mode of the invention, wherein the substrate voltage VLsub is applied to raise up the potential barrier so that the self-induced drift or the thermal diffusion be suppressed, and then the signal charges are read out from the desired regions of the photo-electric conversion unit into the vertical charge transfer unit.

Further, according to the present invention, the disadvantage that the signal charges decrease depending upon the storage time is also overcome by the second mode of the invention, wherein the gate voltage VLg of reset transistor 211 is applied to raise up the potential barrier so that the self-induced drift or the thermal diffusion be suppressed, and then the signal charges are read out from the desired regions of the photo-electric conversion unit into the vertical charge transfer unit.

PREFERRED EMBODIMENT OF THE INVENTION

Figure 1:
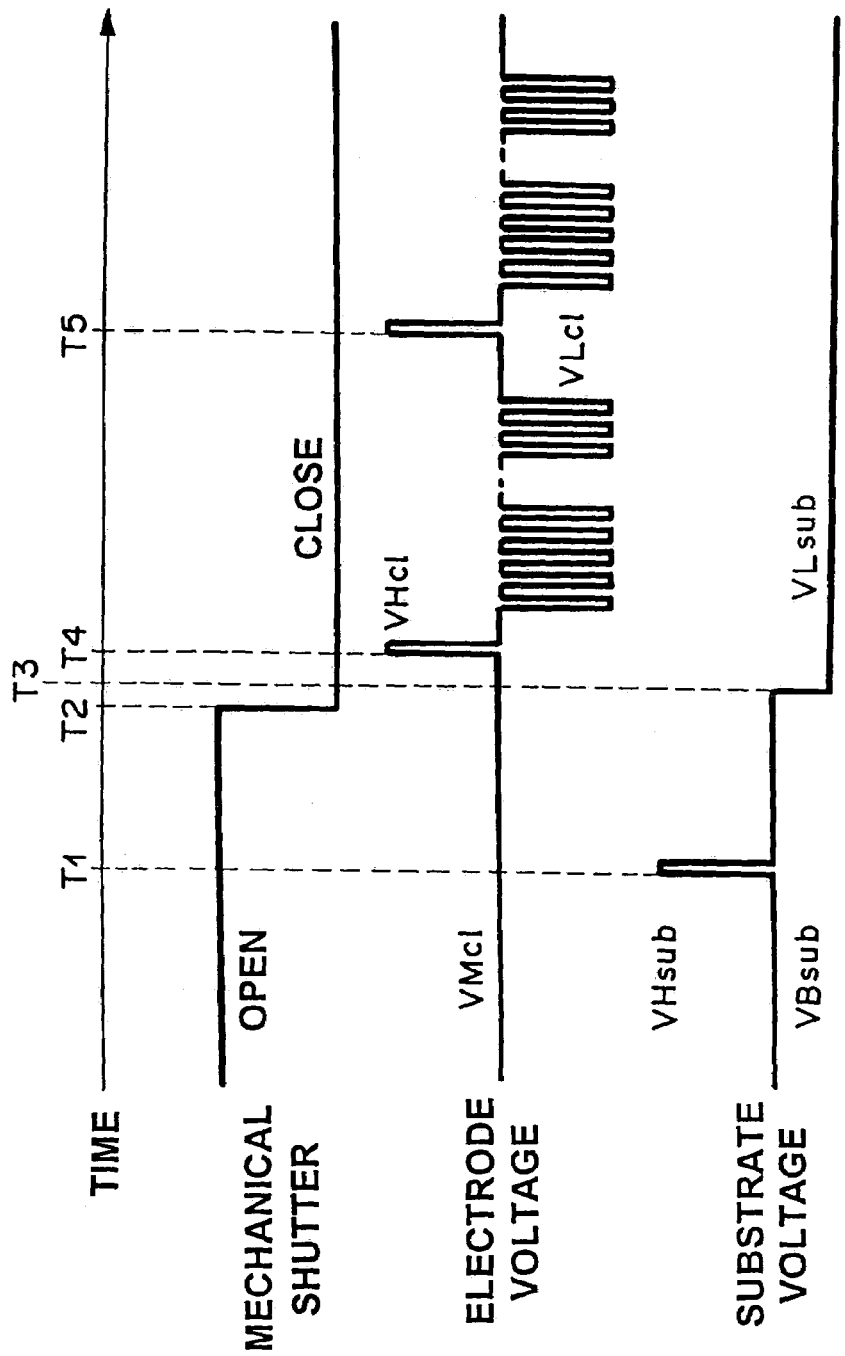
FIG. 1 is a timing chart for driving the solid-state image pickup device of the first mode of embodiment of the present invention.

The first mode of embodiment of the present invention is explained, referring to the drawings.

The operation of the first mode of the invention is explained, referring to the timing chart as shown in FIG. 1, concerning about the interlace solid-state image pickup device with the vertical OFD for the blooming control. The structure of the interlace solid-state pickup device is explained, referring to FIGS. 7 to 9 and 12.

Figure 2:
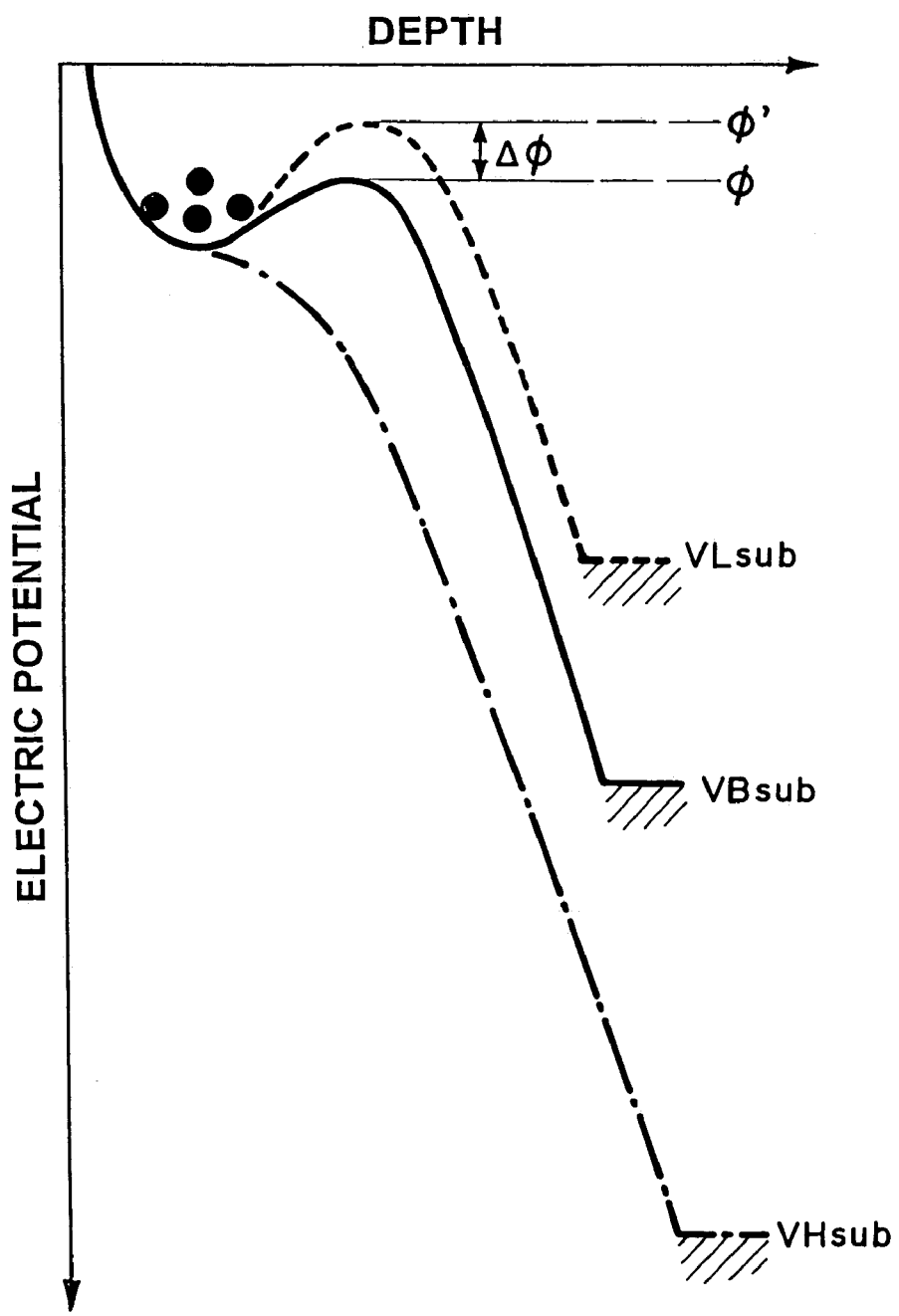
FIG. 2 is a potential diagram of the photo-electric conversion unit with the vertical OFD (overflow drain) of the first mode of embodiment of the present invention.
Figure 8:
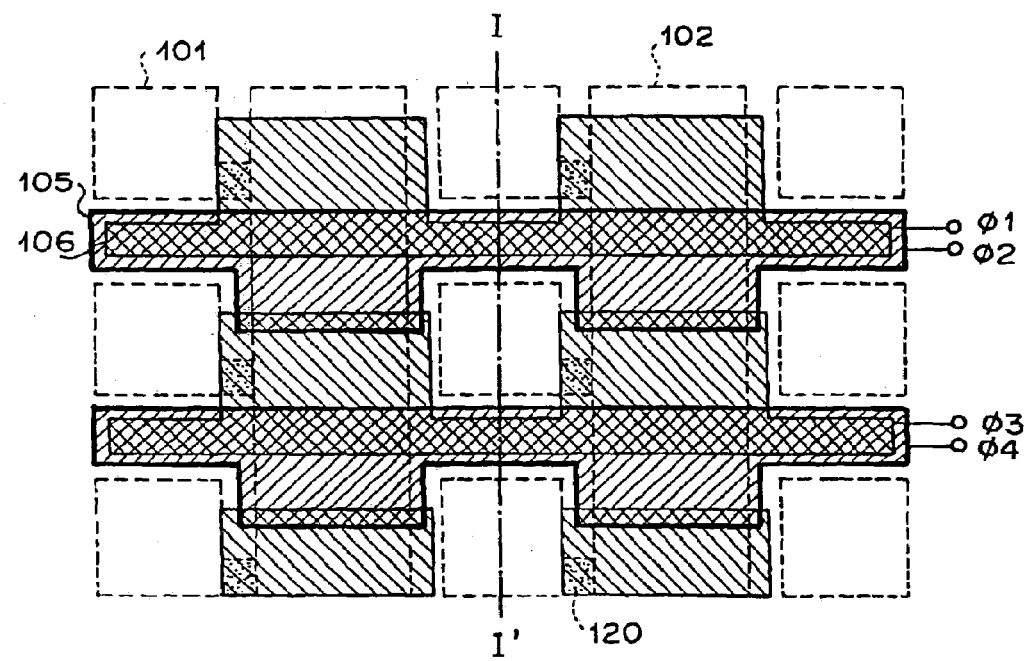
FIG. 8 is a schematic plan view view of a photo-electric conversion unit of the conventional solid-state image pickup device.
Figure 9:
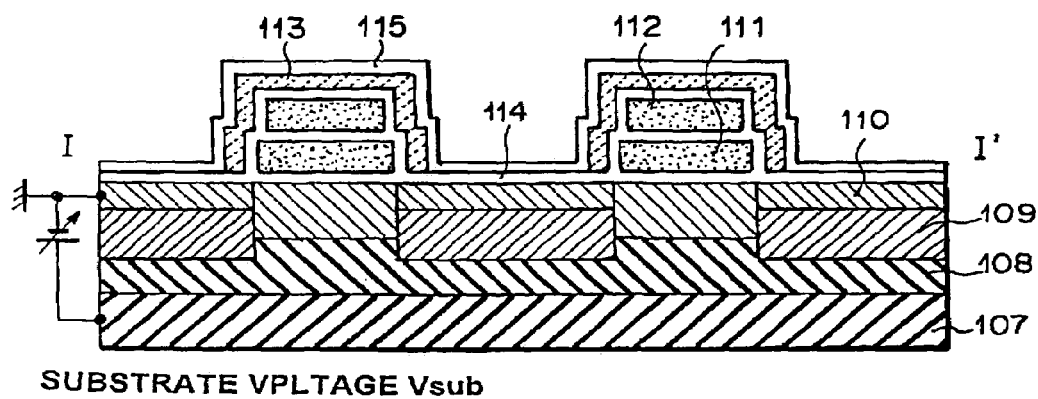
FIG. 9 is a cross sectional view along I-I' lines of the photo-electric conversion unit of the conventional solid-state image pickup device.
Figure 10:
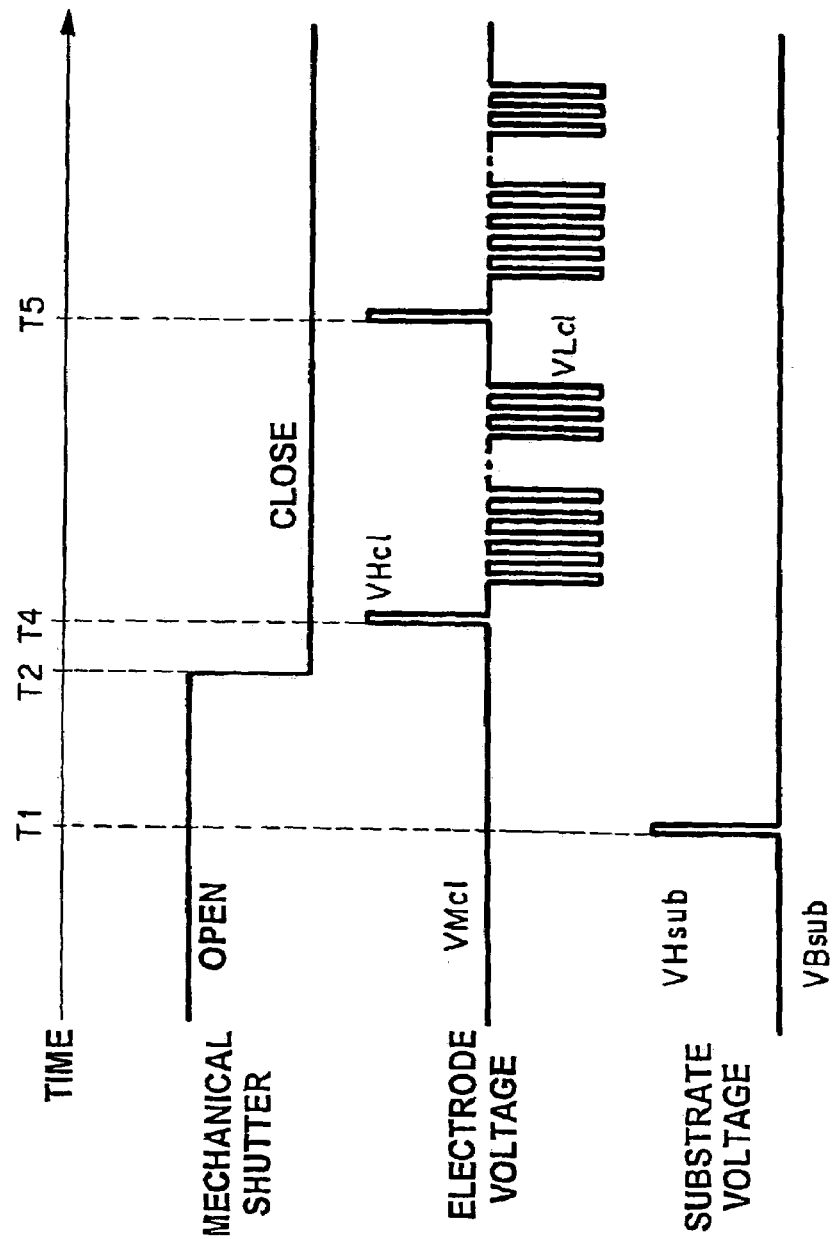
FIG. 10 is a timing chart for driving the conventional solid-state image pickup device.
Figure 11:
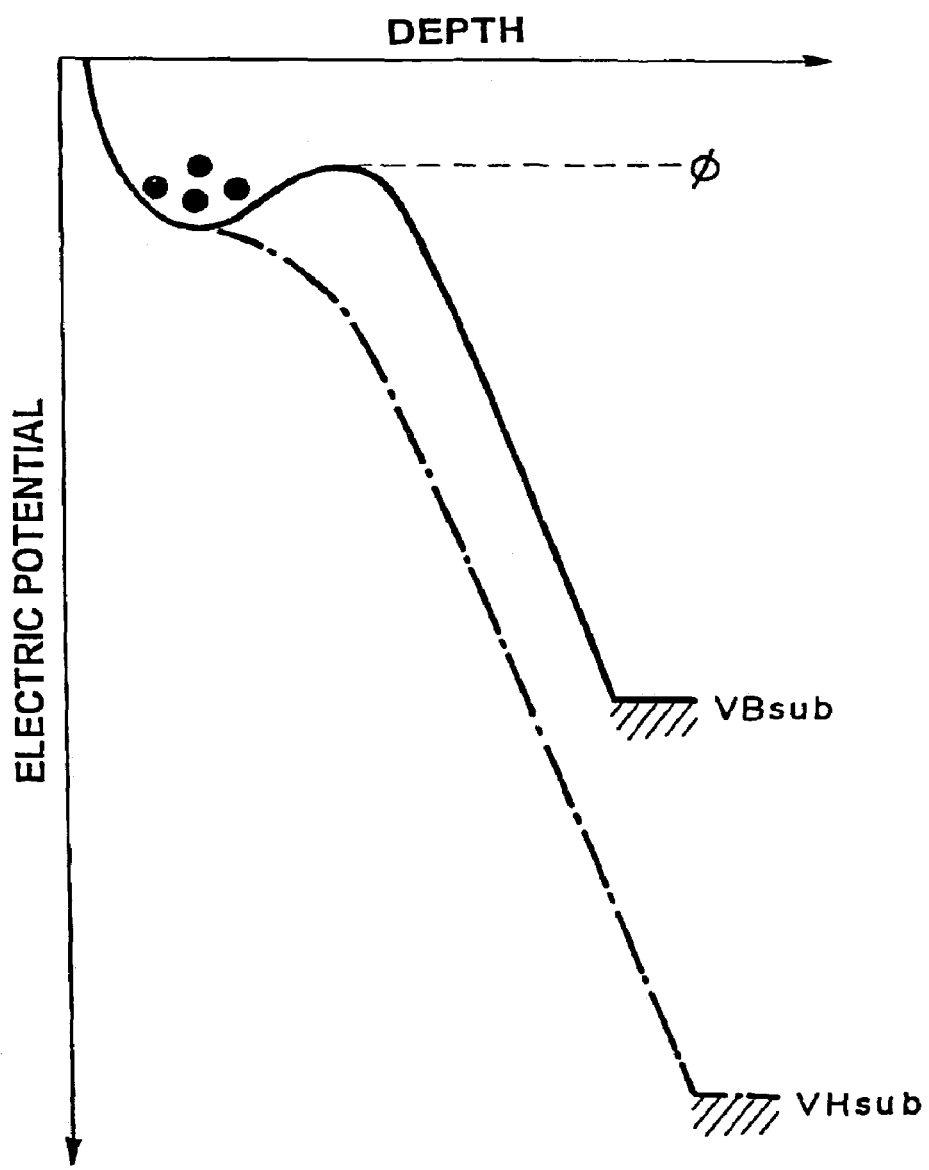
FIG. 11 is a potential diagram of the conventional photo-electric conversion unit with the vertical OFD (overflow drain).

Firstly, in order to reset the charges in photo-electric conversion unit 101 at $t_1$, a reverse bias voltage VHsub is applied to N semiconductor substrate 107 as shown in FIGS. 2, 8 and 9. Hereupon, the charges in photo-electric conversion unit 101 are swept out into N semiconductor substrate 107, because N semiconductor region 109 and P⁻semiconductor region 108 become complete depletion layers.

Next, a voltage VBsub is applied to N⁻semiconductor substrate 107 to start storing signal charges corresponding to the incident light as shown in FIGS. 2 and 9, while surplus charges which can not be stored in photo-electric conversion unit 101 are excluded into N⁻semiconductor substrate 107 by using vertical OFD for the blooming control.

Next, at the moment $t_2$ when a prescribed exposure time ($t_1$–$t_2$) passes, the incident light is cut off by a cut off means such as a mechanical shutter.

Then, at the time $t_3$, a voltage VLsub is applied to N⁻semiconductor substrate 107 to raise up the potential barrier by $\Delta\phi$ of the vertical OFD for the signal charges as shown in FIGS. 2 and 9, whereby the leakage of the signal charges due to the self-induced drift, or the thermal diffusion is suppressed.

The suppression of decreasing the stored signal charges depends sensitively upon $\Delta\phi$ (=$\phi'$–$\phi$).

Figure 6:
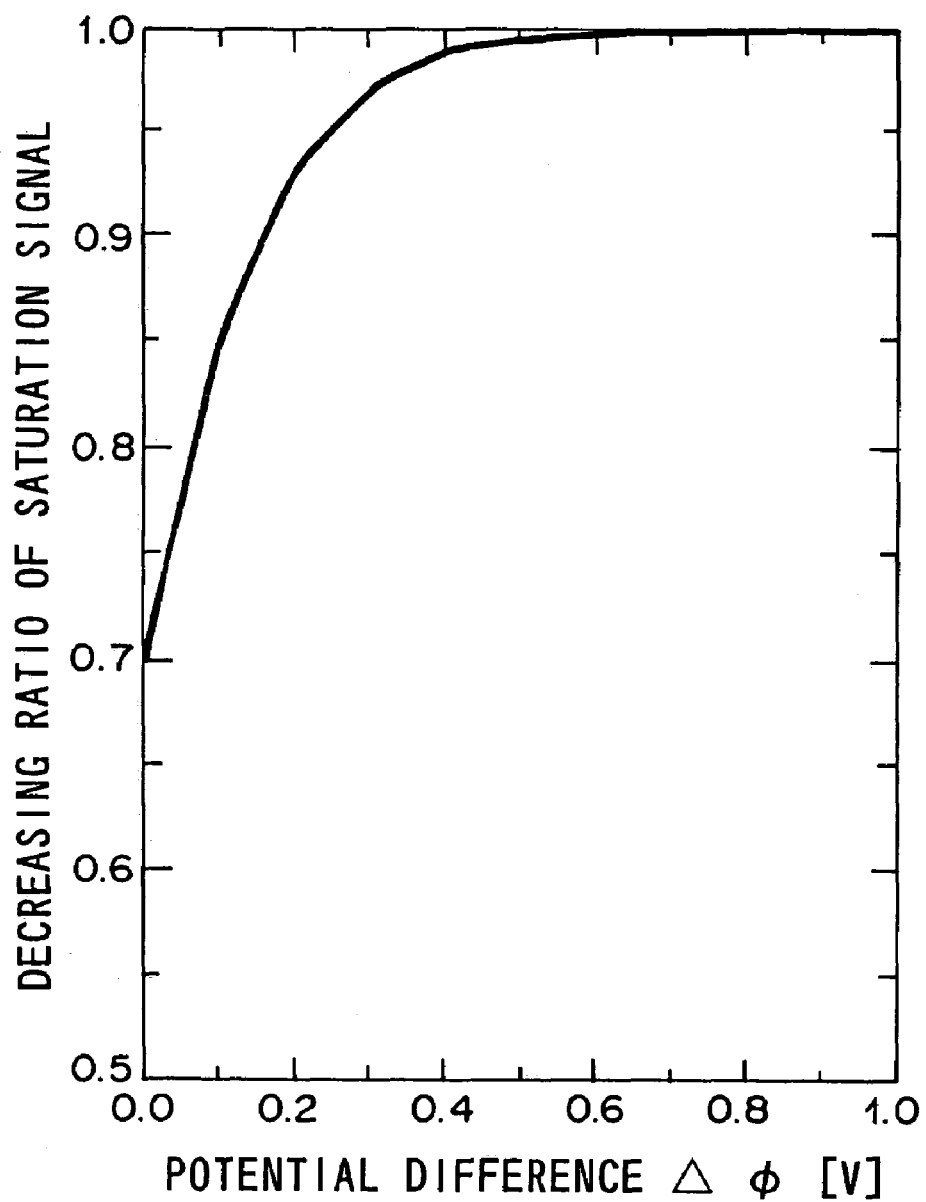
FIG. 6 is a graph showing the relation between the decreasing ratio of saturation signal and the potential difference $\Delta\phi$.

As shown in FIG. 6, the decrease in the signal charges is improved to the negligible level for practical uses, when $\Delta\phi$ is greater than 0.4 V, although $\Delta\phi$ may be more preferably about 0.7 V taking an operation margin into consideration.

Figure 12:
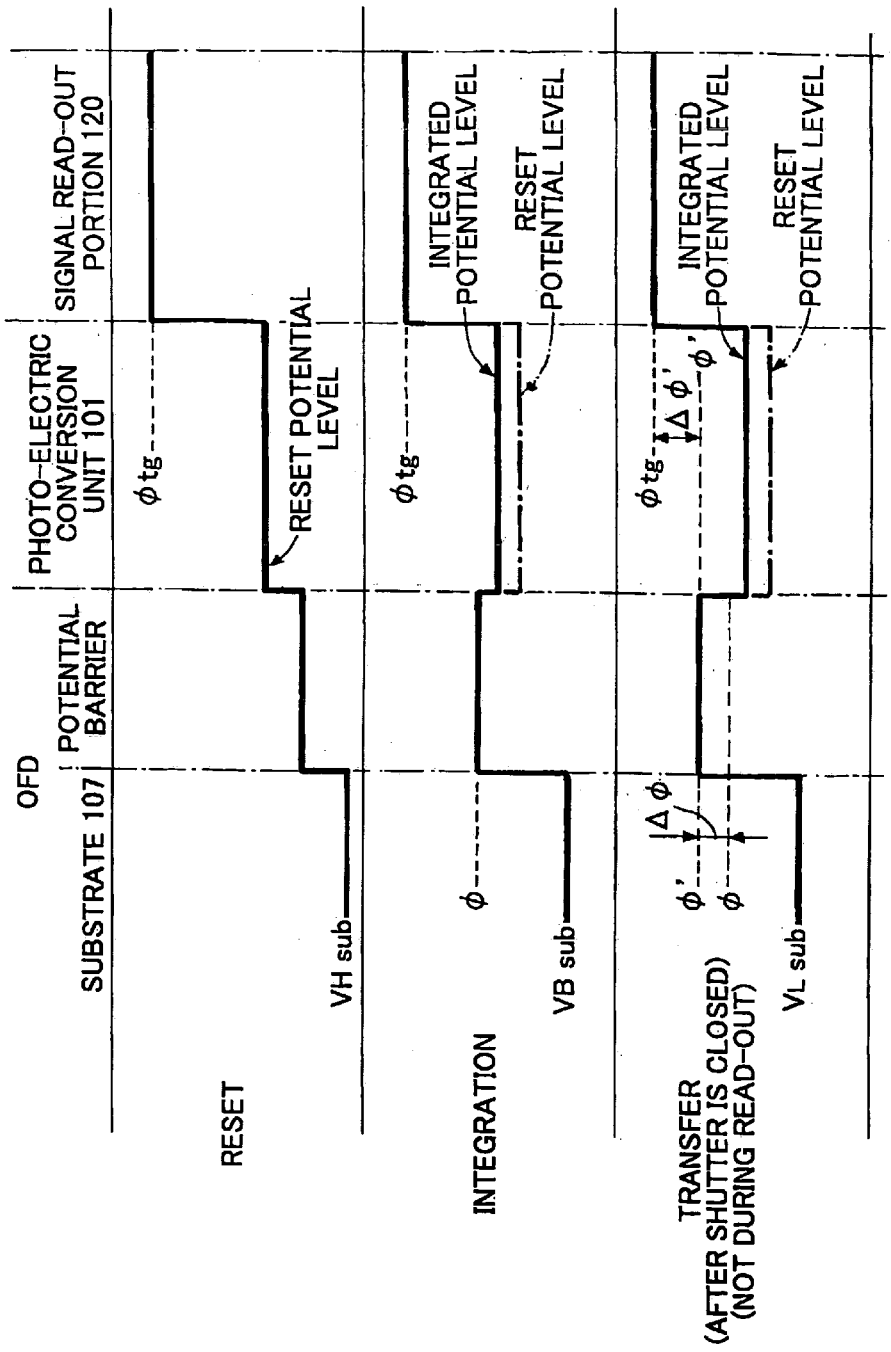
FIG. 12 is a timing chart illustrating an exemplary embodiment of the present invention.

The electric potential $\phi'$ is preferably deeper than $\phi$ tg, the potential of the signal read-out portion 120, is caused by the voltage VMcl which is applied, during the times except the read-out step, to second charge transfer electrode 106 in signal read-out portion 120 adjacent to photo-electric conversion unit 101 as shown in FIG. 12.

When $\phi'$ becomes equal to or shallower than $\phi$ tg, the charges stored in photo-electric conversion unit 101 flows through signal read-out portion 120 into vertical charge transfer unit 102. This undesirable flow of charges depends sensitively upon $\Delta\phi'$ (=$\phi'$–$\phi$ tg). The charge flow is suppressed to the negligible level for practical uses, when $\Delta\phi'$ is greater than 0.4 V, although $\Delta\phi'$ may be more preferably about 0.7 V taking an operation margin into consideration.

Figure 7:
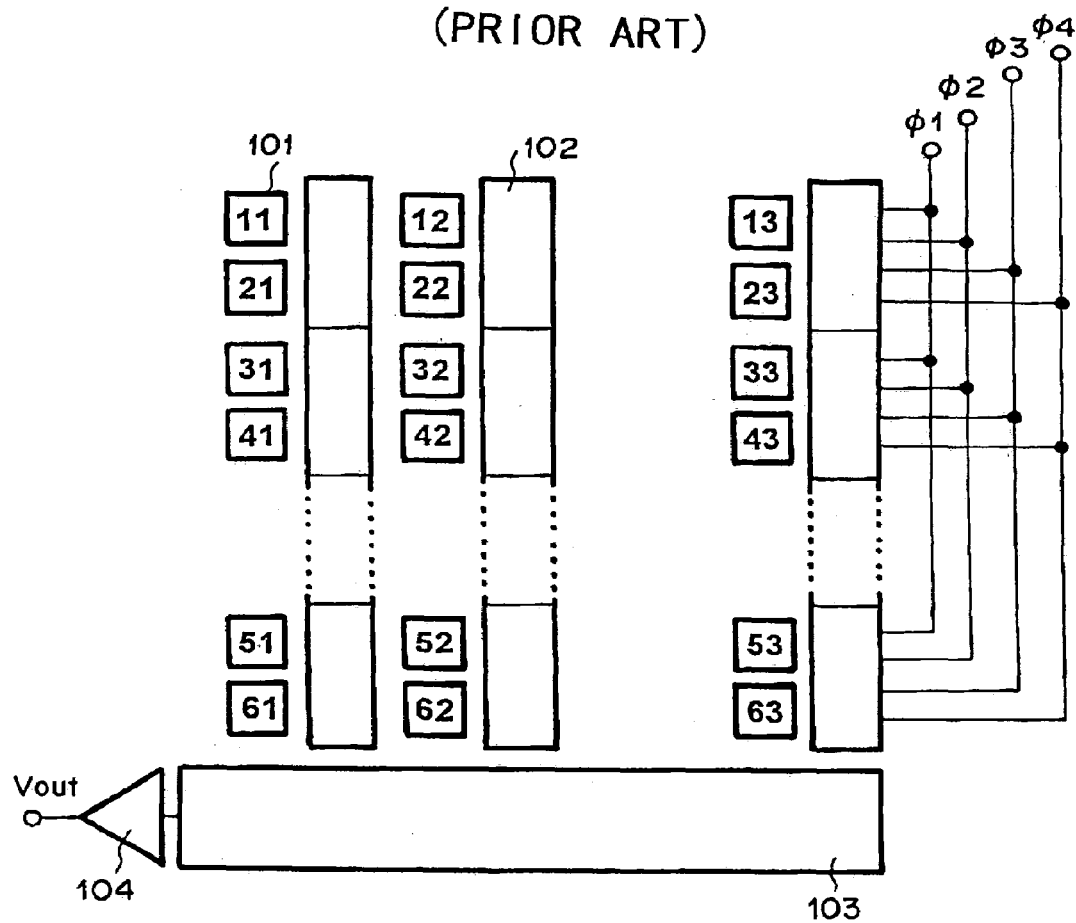
FIG. 7 is a schematic plan view of a conventional solid-state image pickup device.

Then, at the time $t_4$, signal charges, for example, such as signal charges 11,12,13,31,32,33,51,52,53 in photo-electric conversion unit 101 are read out into vertical charge transfer units 102 which transfer vertically the signal charges line by line into horizontal charge transfer unit 103 which transfers the signal charges horizontally to output them from output circuit 104 as shown in FIG. 7.

Finally, at the time $t_5$, signal charges, for example, such as signal charges 21,22,23,41,42,43,61,62,63 in photo-electric conversion unit 101 are read out into vertical charge transfer units 102 and then outputted likewise from output circuit 104. Thus, the signal charges from all of the pixels for one frame of display can be acquired.

The disadvantage that the signal charges decrease depending upon the storage time is overcome by the first mode of the invention, wherein the substrate voltage VLsub is applied to raise up the potential barrier so that the self-induced drift or the thermal diffusion be suppressed, and then the signal charges are read out from the desired regions of the photo-electric conversion unit into the vertical charge transfer unit.

Next, the second mode of embodiment of the present invention is explained, referring to the drawings.

Figure 4:
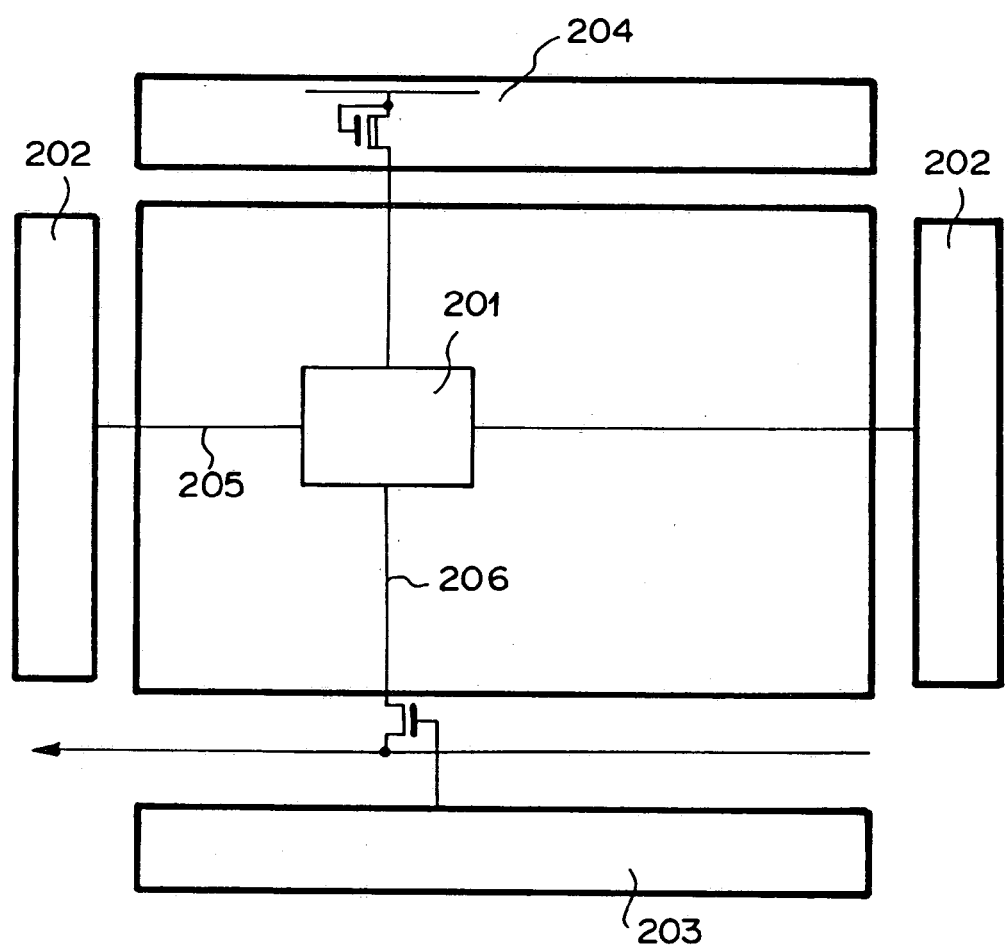
FIG. 4 is a conceptual plan view of the solid-state image pickup device of the second mode of embodiment of the present invention.

A conceptual plan view of an X-Y addressed solid-state image pickup device is shown in FIG. 4.

The X-Y addressed solid-state image pickup device as shown in FIG. 4 comprises photo-electric conversion unit 201, vertical shift register 202, horizontal shift register 203, load transistor 204, address line 205, and signal line 206.

Figure 5A:
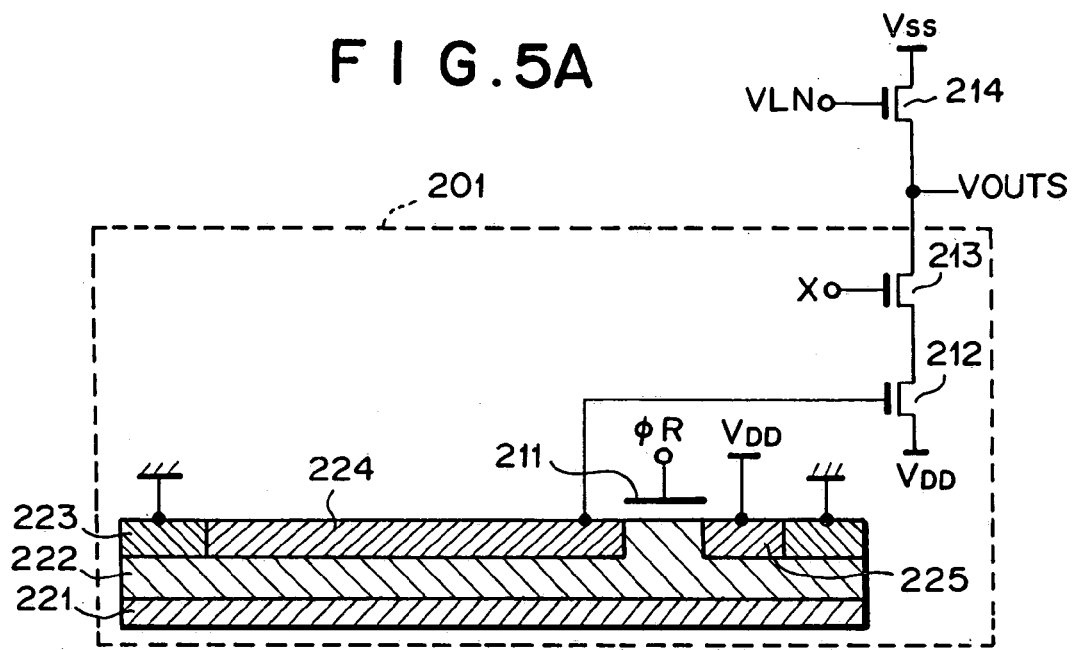
FIG. 5A is a cross sectional view of the photo-electric conversion unit with the horizontal OFD (overflow drain) of the second mode of embodiment of the present invention.

As shown in FIG. 5A, a cross sectional view of photo-electric conversion unit 201 which comprises $P^-$ semiconductor substrate 221, P-semiconductor region 222, $P^+$ semiconductor region 223, N semiconductor region 224, $N^+$ semiconductor region 225, reset transistor 211, driving transistor 212 for a source follower circuit, and selection transistor 213.

Figure 3:
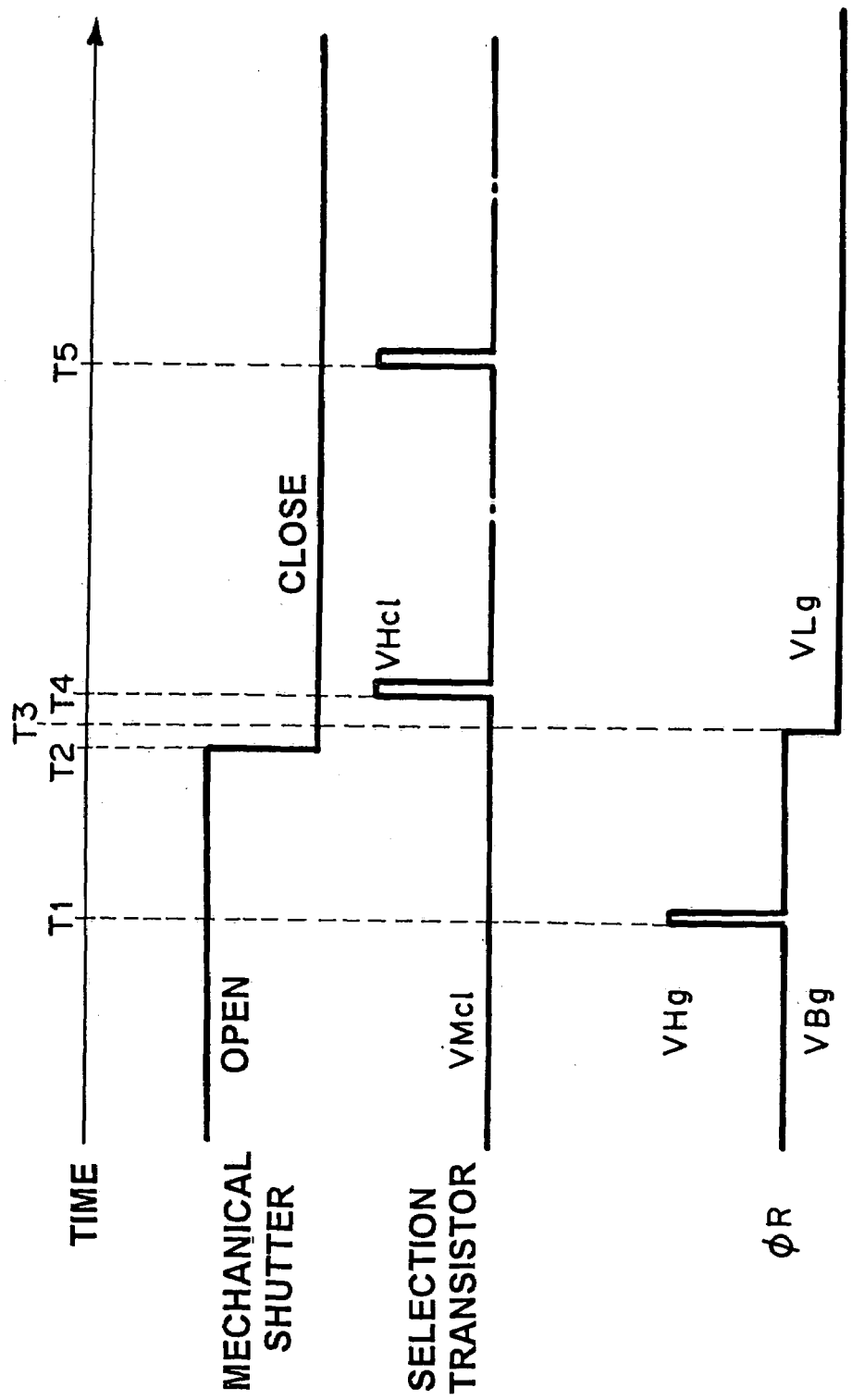
FIG. 3 is a timing chart for driving the solid-state image pickup device of the second mode of embodiment of the present invention.

The operator of the second mode of the invention is explained, referring to the timing chart as shown in FIG. 3, concerning about the X-Y addressed solid-state image pickup device with the horizontal OFD for the blooming control.

Figure 5B:
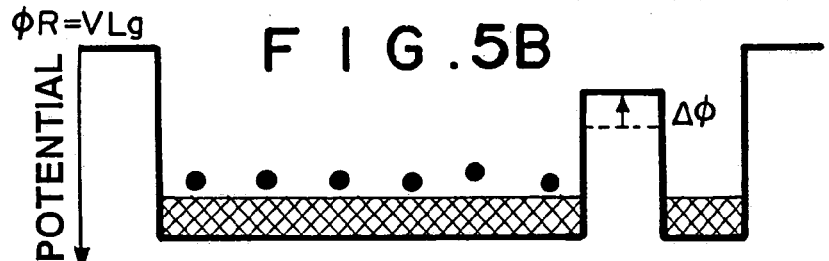
FIGS. 5B, 5C and 5D are potential diagrams of the photo-electric conversion unit with the horizontal OFD (overflow drain) of the second mode of embodiment of the present invention.
Figure 5C:
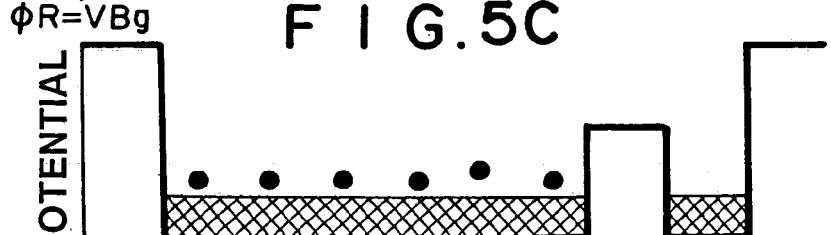
Figure 5D:
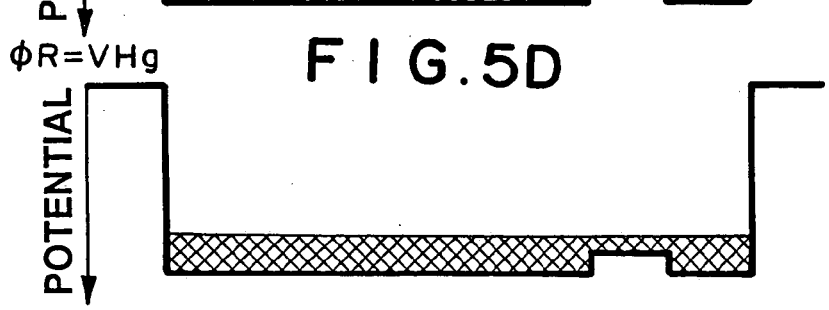

Firstly, in order to reset the charges in photo-electric conversion unit 101 are reset at $t_1$, a voltage VHg is applied to reset transistor 211 as shown in FIG. 5D. Hereupon, the electric potential of reset transistor becomes deep. Further, the electric potential of N semiconductor region 224 in photo-electric conversion unit 201 set to be equal to the voltage VDD of a voltage source.

Next, as shown in FIG. 5C, a voltage VBg is applied to reset transistor 211 in order to start storing signal charges corresponding to the incident light, while surplus charges which can not be stored in photo-electric conversion unit 201 are excluded into $N^+$ semiconductor region 225 by using horizontal OFD for the blooming control.

Next, at the moment $t_2$ when a prescribed exposure time $(t_1-t_2)$ passes, the incident light is cut off by a cut off means such as a mechanical shutter.

Then, as shown in FIG. 5B, at the time $t_3$, a voltage VLg is applied to reset transistor 211 to raise up the potential barrier by $\Delta\phi$ of the horizontal OFD for the signal charges, whereby the leakage of the signal charges due to the self-induced drift, or the thermal diffusion is suppressed.

The suppression of decreasing the stored signal charges depends sensitively upon $\Delta\phi$ $(=\phi'-\phi)$.

The decrease in the signal charges is improved to the negligible level for practical uses, when $\Delta\phi$ is greater than 0.4 V, although $\Delta\phi$ may be more preferably about 0.7 V taking an operation margin into consideration.

$\Delta\phi$ may be preferably about 0.7 V for such a suppression.

Then, at the time $t_4$, signal charges, for example, such as signal charges are read out from the odd lines and outputted.

Finally, at the time $t_5$, signal charges are read out from the even lines and then outputted. Thus, the signal charges from all of the pixels for one frame of display can be acquired.

The disadvantage that the signal charges decrease depending upon the storage time is overcome by the second mode of the invention, wherein the gate voltage VLg of reset transistor 211 is applied to raise up the potential barrier so that the self-induced drift or the thermal diffusion be suppressed, then the signal charges are read out from the desired regions of the photo-electric conversion unit into the vertical charge transfer unit.

It should be understood by those skilled in the art that the foregoing and various other changes, omissions, and additions in the form and detail thereof may be made therein without departing from the spirit and scope of the present invention. For example, the present invention is applicable to a device with signal read-out portion 120, although the second mode of embodiment is lack of the signal read-out portion 120 which may be formed adjacent to photo-electric conversion unit 101.

What is claimed is:

1. A method for driving a solid-state image pickup device which stores, in a plurality of photo-electric conversion units, signal charges corresponding to an incident light during a prescribed time period, each of said photo-electric conversion units being provided with an overflow drain (OFD) structure, excludes surplus charges from said photo-electric conversion units by an electric potential barrier, said electric potential barrier being maintained at a first level between said OFD structure and each of said photo-electric conversion units during said prescribed time period, reads out, after cutting off said incident light by a cut-off means such as a mechanical shutter, said signal charges by grouping said photo-electric conversion units into a prescribed number of regions, and outputs image signal from all of the photo-electric conversion units by repeating the read-out procedures, said read-out procedures being carried out during a time period other than said prescribed time period, said read-out procedures comprising the steps of:
   cutting off said incident light;
   raising up said electric potential barrier to a higher level than said first level after said cutting off of said incident light; and
   starting reading out said signal charges.

2. The method for driving a solid-state image pickup device according to claim 1, wherein said electric potential barrier during the read-out step is raised up by a voltage greater than 0.4.V.

3. The method for driving a solid-state image pickup device according to claim 1, wherein said OFD structure is a vertical OFD structure which excludes the surplus charges from said photo-electric conversion units by said electric potential barrier by a voltage applied to a substrate of said vertical OFD structure, which comprises the steps of:
   cutting off said incident light;
   raising up said electric potential barrier after said cutting off of said incident light; and
   starting reading out said signal charges.

4. The method for driving a solid-state image pickup device according to claim 3, wherein said electric potential barrier during the read-out step is raised up by a voltage greater than 0.4V.

5. The method for driving a solid-state image pickup device according to claim 1, wherein said OFD structure is a horizontal OFD structure which excludes the surplus charges from said photo-electric conversion units by said electric potential barrier by a voltage applied to a gate of said horizontal OFD structure, which comprises the steps of:
   cutting off said incident light;

raising up said electric potential barrier after said cutting off of said incident light; and starting reading out said signal charges.

6. The method for driving a solid-state image pickup device according to claim 5, wherein said electric potential barrier during the read-out step is raised up by a voltage greater than 0.4V.

7. The method for driving a solid-state image pickup device according to claim 1, wherein said signal charges are read-out from said photo-electric conversion units through signal read-out portions and the electric potential of said electric potential barrier during the read-out step is deeper than an electric potential which is applied in signal read-out portion during the times except said read-out step.

8. The method for driving a solid-state image pickup device according to claim 7, wherein the potential different between said electric potential of said electric potential barrier during the read-out step and said electric potential which is applied in said signal read-out portion is greater than 0.4V.

9. The method for driving a solid-state image pickup device according to claim 3, wherein said signal charges are read-out from said photo-electric conversion units through signal read-out portions and the electric potential of said electric potential barrier during the read-out step is deeper than an electric potential which is applied in signal read-out portion during the times except said read-out step.

10. The method for driving a solid-state image pickup device according to claim 9, wherein the potential difference between said electric potential of said electric potential barrier during the read-out step and said electric potential which is applied in said signal read-out portion is greater than 0.4V.

11. The method for driving a solid-state image pickup device according to claim 5, wherein said signal charges are read-out from said photo-electric conversion units through signal read-out portions and the electric potential of said electric potential barrier during the read-out step is deeper than an electric potential which is applied in signal read-out portion during the times except said read-out step.

12. The method for driving a solid-state image pickup device according to claim 11, wherein the potential difference between said electric potential of said electric potential barrier during the read-out step and said electric potential which is applied in said signal read-out portion is greater than 0.4V.

13. A method for driving a solid-state image pickup device which stores, in a plurality of photo-electric conversion units, signal charges corresponding to an incident light during a prescribed time period, each of said photo-electric conversion units being provided with an overflow drain (OFD) structure, excludes surplus charges from said photo-electric conversion unit by an electric potential barrier, said electric potential barrier being maintained between said photo-electric conversion unit and said OFD structure which is next to said photo-electric conversion unit, reads out, after cutting off said incident light by a cut-off means such as a mechanical shutter, said signal charges by grouping said photo-electric conversion units into a prescribed number of regions, and outputs an image signal from all of the photo-electric conversion units by repeating the read-out procedure, which comprises the steps of:

cutting off said incident light;

raising up said electric potential barrier after said cutting off of said incident light; and starting reading out said signal charges.

14. The method for driving a solid-state image pickup device according to claim 13, wherein said electric potential barrier during the read-out step is raised up by a voltage greater than 0.4V.

15. The method for driving a solid-state image pickup device according to claim 13, wherein said signal charges are read out from said photo-electric conversion units through signal read-out portions and the electric potential of said electric potential barrier during the read-out step is deeper than an electric potential which is applied in said signal read-out portion during time periods other than said read-out step.

16. The method for driving a solid-state image pickup device according to claim 15, wherein the potential difference between said electric potential of said electric potential barrier during the read-out step and said electric potential which is applied in said signal read-out portion is greater than 0.4V.

* * * * *